US007356796B2

(12) United States Patent
Lee et al.

(10) Patent No.: US 7,356,796 B2
(45) Date of Patent: Apr. 8, 2008

(54) METHOD AND APPARATUS TO BOOST HIGH-SPEED I/O SIGNAL PERFORMANCE USING SEMI-INTERLEAVED TRANSMITTER/RECEIVER PAIRS AT SILICON DIE BUMP AND PACKAGE LAYOUT INTERFACES

(75) Inventors: Cliff Lee, Portland, OR (US); Scott T. Gardiner, Beaverton, OR (US); Jeffrey L. Krieger, Portland, OR (US); Jen-Tai Hsu, El Dorado Hills, CA (US); Fei Deng, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 330 days.

(21) Appl. No.: 11/170,558

(22) Filed: Jun. 28, 2005

(65) Prior Publication Data

US 2006/0292739 A1    Dec. 28, 2006

(51) Int. Cl.
*G06F 17/50* (2006.01)

(52) U.S. Cl. .......................................................... 716/8
(58) Field of Classification Search .................. 716/2, 716/8, 15, 17
See application file for complete search history.

(56) References Cited

U.S. PATENT DOCUMENTS

| 6,584,606 | B1* | 6/2003 | Chiu et al. ..................... 716/10 |
| 6,661,940 | B2* | 12/2003 | Kim ............................. 385/15 |
| 7,043,703 | B2* | 5/2006 | Nation et al. ................... 716/1 |
| 2003/0183919 | A1* | 10/2003 | Devnani et al. ............. 257/691 |
| 2006/0064660 | A1* | 3/2006 | Chung-Maloney et al. .... 716/8 |

* cited by examiner

*Primary Examiner*—Stacy Whitmore
(74) *Attorney, Agent, or Firm*—Blakely, Sokoloff, Taylor & Zafman LLP

(57) ABSTRACT

A microelectronic circuit structure containing interleaved copies of a first circuit pattern and a second circuit pattern, each circuit pattern containing a transmitter and a receiver, where transmitters and receivers of the two circuit patterns are positioned so that the two transmitters are adjacent or so that the two receivers are adjacent. Other structures and methods are also described and claimed.

16 Claims, 5 Drawing Sheets

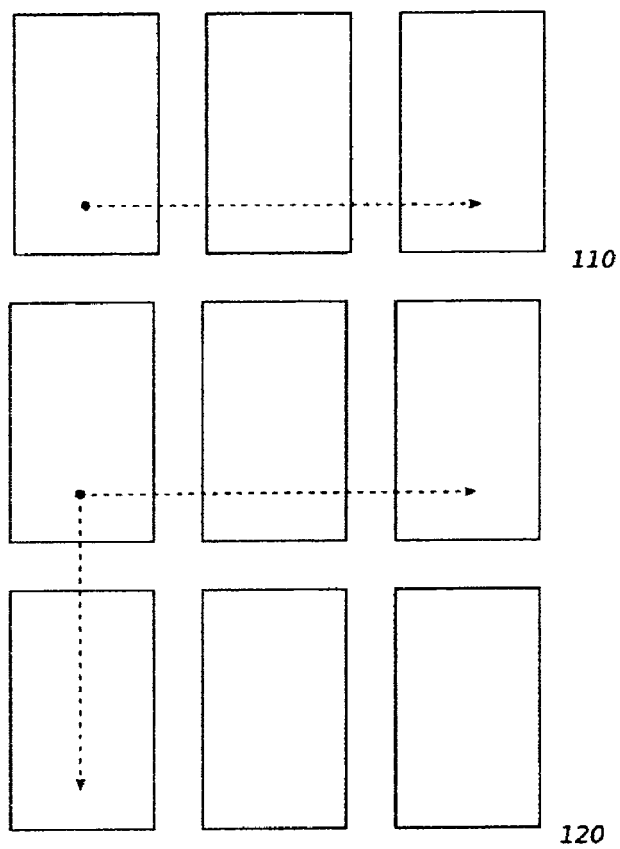
Figure 1
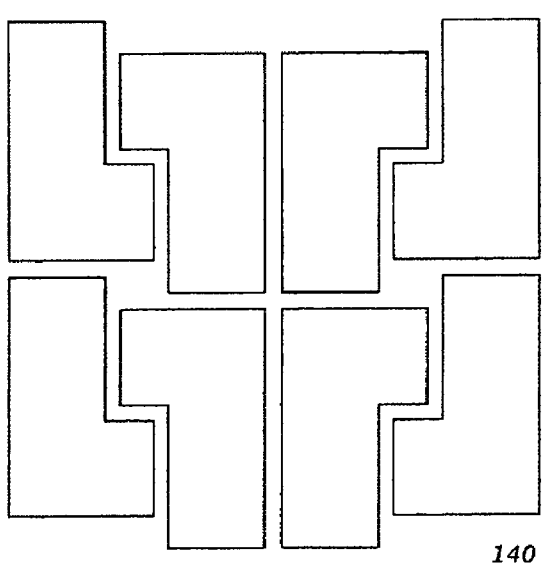
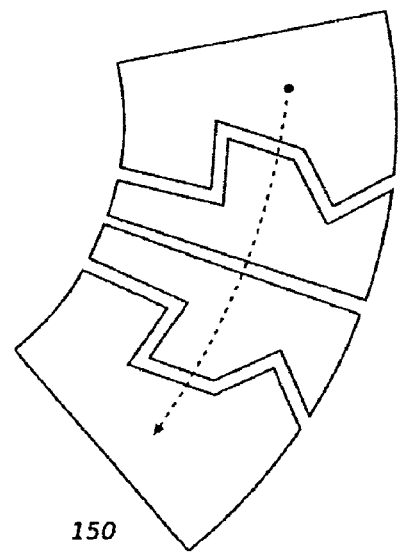

METHOD AND APPARATUS TO BOOST HIGH-SPEED I/O SIGNAL PERFORMANCE USING SEMI-INTERLEAVED TRANSMITTER/RECEIVER PAIRS AT SILICON DIE BUMP AND PACKAGE LAYOUT INTERFACES

FIELD OF THE INVENTION

The invention relates to microelectronic layout techniques. More specifically, the invention relates to layout techniques that permit improved performance without requiring extensive redesign, verification and testing.

BACKGROUND

Microelectronic circuits have been fabricated on semiconductors by various processes for many years. As circuits have become more complex, various techniques have developed to permit the efficient design and verification of circuits and systems. One important technique in microelectronic circuit design is the use of standard cells or "splines," which are pre-configured circuit units that are designed to perform common functions correctly and efficiently, and to be useable in a variety of contexts. For example, a spline might implement a single-bit memory cell, and be designed so that a multi-bit register of arbitrary width can be added to a circuit simply by placing an appropriate number of copies of the spline next to each other. The spline might usefully have power and ground lines arranged so that the entire register could be powered simply by providing power to fixed locations on one of the spline copies; input and output lines could similarly be placed so that the register could easily be connected to surrounding circuitry without requiring extensive, complex routing.

Individual splines can be extensively modeled, verified, and optimized, so that arrays of splines may approach the space-efficiency of a full-custom layout to perform the same function, with greatly improved confidence in the correctness and manufacturability of the resulting part. In addition, a correction or improvement in a spline will automatically benefit any circuit that uses the spline, and if the spline's connection points are undisturbed, very little additional work may be required to produce devices using the improved layout.

Splines are often designed to be placed in regular arrays, where each copy is located at a fixed displacement from the previous copy. Sometimes, the displacement is simply a translation of a particular distance along a single axis, as shown in FIG. 1, 110; but some splines might be suitable for use in two-dimensional arrays (120), for placement after translation and rotation (130), placement after reflection (140), or after combinations of translation, reflection, and rotation (150).

Most microelectronic circuits include input and output ("I/O") facilities to exchange data with other circuits and components in a system. Such facilities often operate in parallel: a number of data signals are transmitted or received simultaneously over several physical signal lines, rather than being sent or received sequentially over a single line. Thus, a standard circuit to produce or detect data signals can frequently be reused, and may be a good candidate for implementation in a spline.

In many situations, physically and/or logically proximate lines carry signals in both directions; sometimes a single physical interconnection will carry an outbound (transmitted) signal from a circuit, and shortly thereafter carry an inbound (received) signal to the circuit. In these cases, a spline containing both a transmitter and a receiver may be a useful building block for a circuit designer. The transmitters and receivers themselves may perform either single-ended or differential signaling, methods which are well-known in the art.

Since the transmitter and receiver circuits frequently communicate with system components outside the microelectronic circuit (as opposed to intra-circuit communications), they are often placed at or near the perimeter of a circuit layout, and connect directly to conductors leading to pins or contact points on the exterior of an integrated circuit package. These conductors are usually spaced at regular intervals, so transmitter and/or receiver splines must be sized and designed so that their contact points match the conductor positions. The external connection-point constraints of a microelectronics package substrate and the orientation of the package pins is called the package's "ball-out," while the orientation of the contact points of a spline is called the spline's "bump-out."

A common practice is to include a single transmitter and a single receiver within one spline. Grouping a transmitter together with a receiver in a spline facilitates the scalability of the I/O design interface, because additional splines can be added as needed to produce the number of transmitter and receiver pairs required by a given interface. FIG. 2 shows a single spline containing a transmitter 210 and a receiver 220. Power 230 and ground 240 lines are provided so that copies of the spline replicated along the spline's short dimension can easily obtain power from (or through) their neighbors, as shown in inset 250. The transmitter portion of the spline connects to external circuitry through a connection point 260, while the receiver portion is connected through connection 270. The location of these connection points (the spline's bump-out) may be constrained by the physical arrangement of a carrier or lead frame that connects points on the semiconductor substrate with external electrodes or pins, as defined by the ball-out. Note that the array of spline copies in inset 250 has the transmitter and receiver connection points arranged in a regular "zig-zag" pattern 255 to optimize density and distribution of the contact points. At other locations within the spline (e.g. 280 and 290), connection points between the spline circuitry and other circuits within the microelectronic device are provided. The locations of these latter connection points may not be limited by external physical constraints, but it may nevertheless be undesirable to change these locations if a new or improved spline is to be substituted, because changing the locations may necessitate alteration of the interconnect from the spline to other internal circuits. The task of redesigning internal interconnects of circuits that are already highly optimized and extensively validated and tested may turn out to be more expensive and involved than any benefits realized from an improved spline.

BRIEF DESCRIPTION OF DRAWINGS

Embodiments of the invention are illustrated by way of example and not by way of limitation in the figures of the accompanying drawings in which like references indicate similar elements. It should be noted that references to "an" or "one" embodiment in this disclosure are not necessarily to the same embodiment, and such references mean "at least one."

FIG. 1 is a diagram of a number of possible arrangements of standard cells in a microelectronic layout.

DETAILED DESCRIPTION

Figure 2:
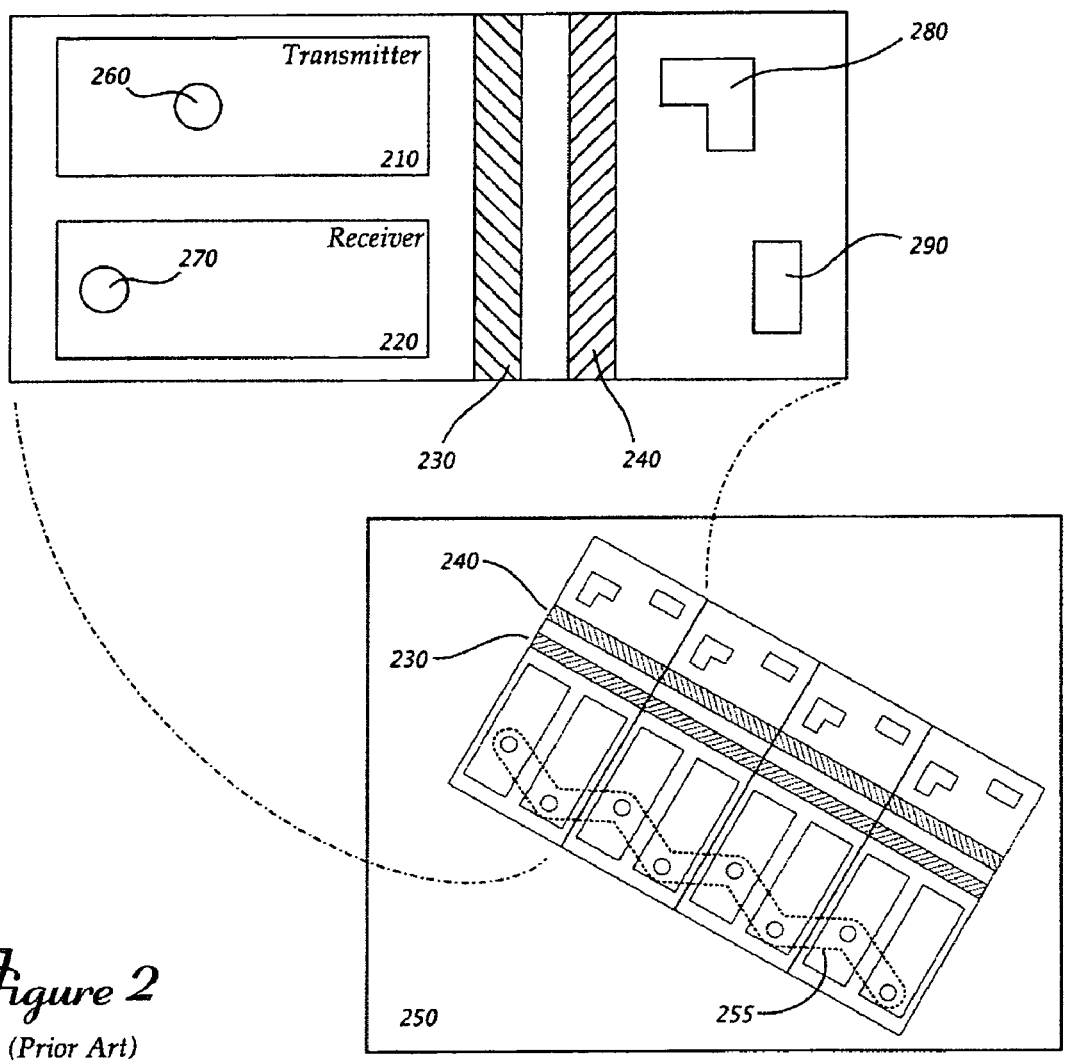
FIG. 2 is a conceptual diagram of a prior-art spline containing a transmitter and a receiver, with an example array of the splines showing how power and ground connections can be made.

As improvements in equipment, process technology, and material uniformity permit smaller circuit elements and higher operational speeds, arrays of transmitters and receivers may begin to suffer from signal degradation because of cross-coupling effects exacerbated by increased proximity. FIG. 3 shows an array of transmitter/receiver pairs composed of copies of the spline shown in FIG. 2. In such an array, the signal-to-noise ratio of each receiver 310 may be compromised by the operation of the two adjacent transmitters 320 and 330. One way of addressing this interference is to separate transmitters and receivers into disjoint groups, as shown at 340. This may provide the best isolation between transmitters and receivers, but is also likely to require extensive changes to both internal and external connections for the spline, as well as create problems with the package ball-out requirements, potentially increasing package substrate cost and increasing time required for the package substrate interconnection layout and design. Separating the transmitters and receivers also fundamentally changes the nature of the transmitter plus receiver coexistence within a single spline. For example, a transmitter and receiver pair no longer reside within a single spline in 340; instead, each spline now includes only a single transmitter or receiver. Adding or subtracting a single transmitter and receiver combination from the interface, as is commonly required during the reuse of a previous design in a new product, is no longer a trivial task. Additionally, the previous zig-zag pattern of the bump-out no longer exists; restoring the pattern may require design of two different versions of each receiver and transmitter spline.

Another alternative is to interleave pairs of transmitters and receivers, as shown at 350. By preparing a first spline comprising two transmitters (360) and a second spline comprising two receivers (370), arrays of Tx/Rx pairs can be created wherein each receiver is adjacent to only one transmitter. However, in situations where only a single Tx/Rx pair is required, a third spline containing the pair must be designed, validated and tested, or one transmitter and receiver of splines 360 and 370 must be left unused, wasting space in the layout. Furthermore, as shown at 350, bumpout requirements may necessitate further adjustment of the transmitter-pair and receiver-pair splines, and internal routing changes are also likely to be required.

Figure 4:
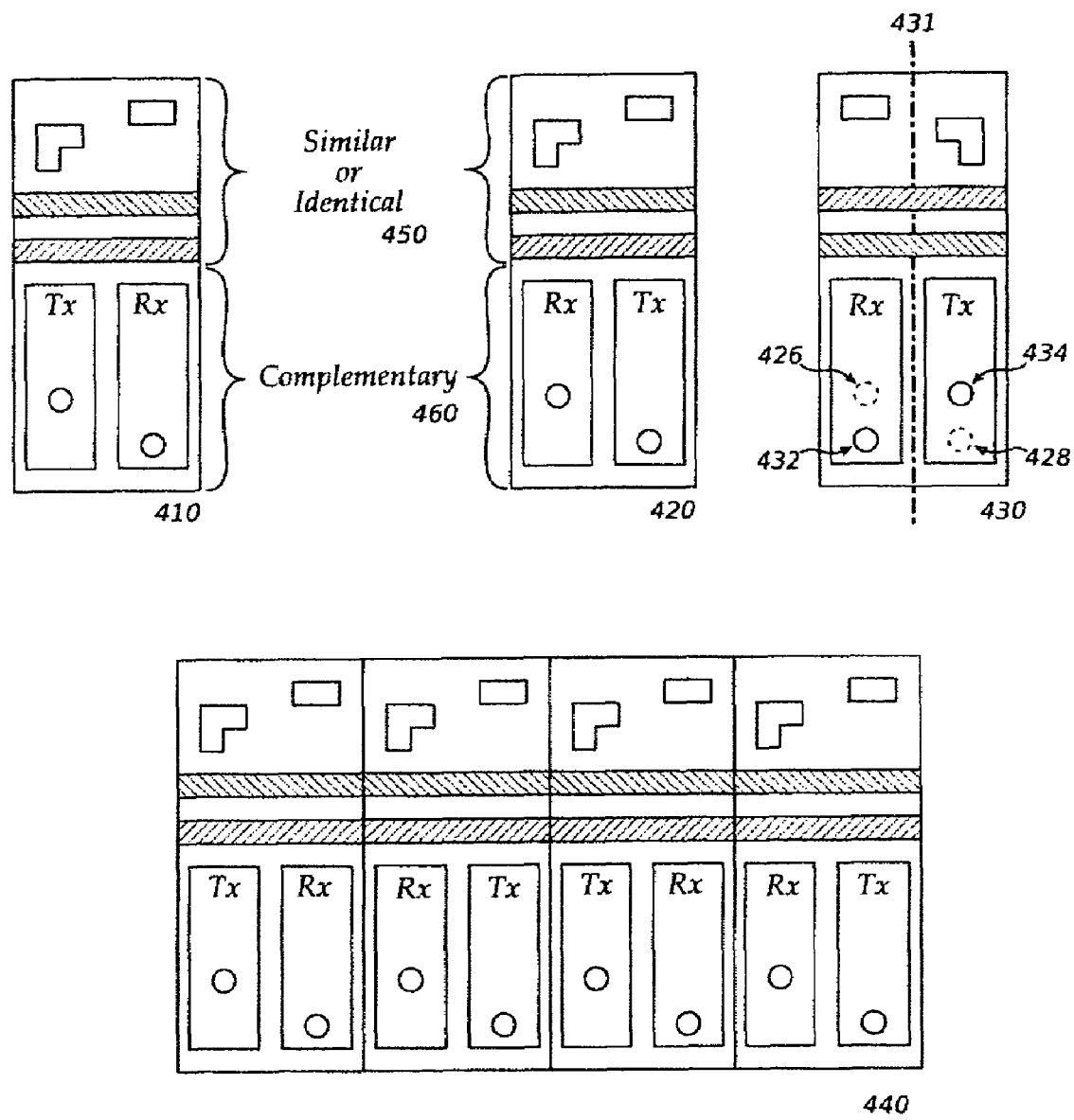
FIG. 4 is a conceptual diagram of complementary splines designed to address the problem discussed with reference to FIG. 3.

An embodiment of the invention can address many of the drawbacks mentioned in the discussion of possible design solutions 340 and 350. By preparing two complementary splines, each containing a transmitter and a receiver, arrays of Tx/Rx pairs where no receiver is adjacent to two transmitters can be created, and a single spline can be used where only one Tx/Rx pair is required, without wasted space. Using these complementary splines can also allow for the traditional ball-out constraints of the package to be met when, for example, all transmitter and receiver signals must be located within a confined area. FIG. 4 shows a possible layout for such complementary splines, identified as elements 410 and 420. Note that 420 is not simply a reflected copy of 410: a reflection (shown as 430) would leave connection points that are not symmetrical about the axis of reflection 431 in the wrong location (432 and 434 instead of 426 and 428).

An array of interleaved copies of splines 410 and 420 places transmitters and receivers in a Tx-Rx-Rx-Tx (or, alternately, Rx-Tx-Tx-Rx) pattern, so that each receiver is adjacent to only one transmitter (see element 440). In other words, like elements of each of the two cells are positioned nearer to each other than to at least one unlike element when the two splines are placed next to each other. This arrangement may permit an improved signal-to-noise ratio for the receivers, and either spline may be used where only a single Tx/Rx pair is necessary. An arbitrary number of transmitter/receiver pairs can be formed by placing copies of the splines so that each spline of the first design is adjacent to a spline of the second design.

Splines 410 and 420 contain a complementary portion indicated as 460, but may further include a similar or identical portion 450. The similar or identical portion may permit the splines to be substituted into designs containing arrays of older, single-spline Tx/Rx pairs without requiring redesign of the internal interconnect circuitry. The similar portions are not (and need not be) complementary because they contain circuitry that is not susceptible to the proximity/cross-talk problems of the transmitter and receiver sections. Instead, the similar portions are designed to be interchangeable with respect to some connection points. This can improve the applicability and reusability of the splines. Thus, through appropriate design of complementary splines 410 and 420, improved performance resulting from a rearrangement or repositioning of the transmitters and receivers can be achieved. Moreover, the rerouting work (both internally and externally) that might otherwise be required when splines are substituted, may be reduced or eliminated.

In some embodiments, an existing Tx/Rx spline may have a layout suitable to serve as one of the two complementary splines. In that case, it may be possible to prepare the second spline by reflecting portions of the cell that implement the transmitter and receiver circuitry and adjusting the reflected portions to conform to bumpout restrictions. When this is possible, an embodiment of the invention can be created with even less investment of design and testing effort than if two new complementary splines were designed to replace an existing cell.

Figure 3:
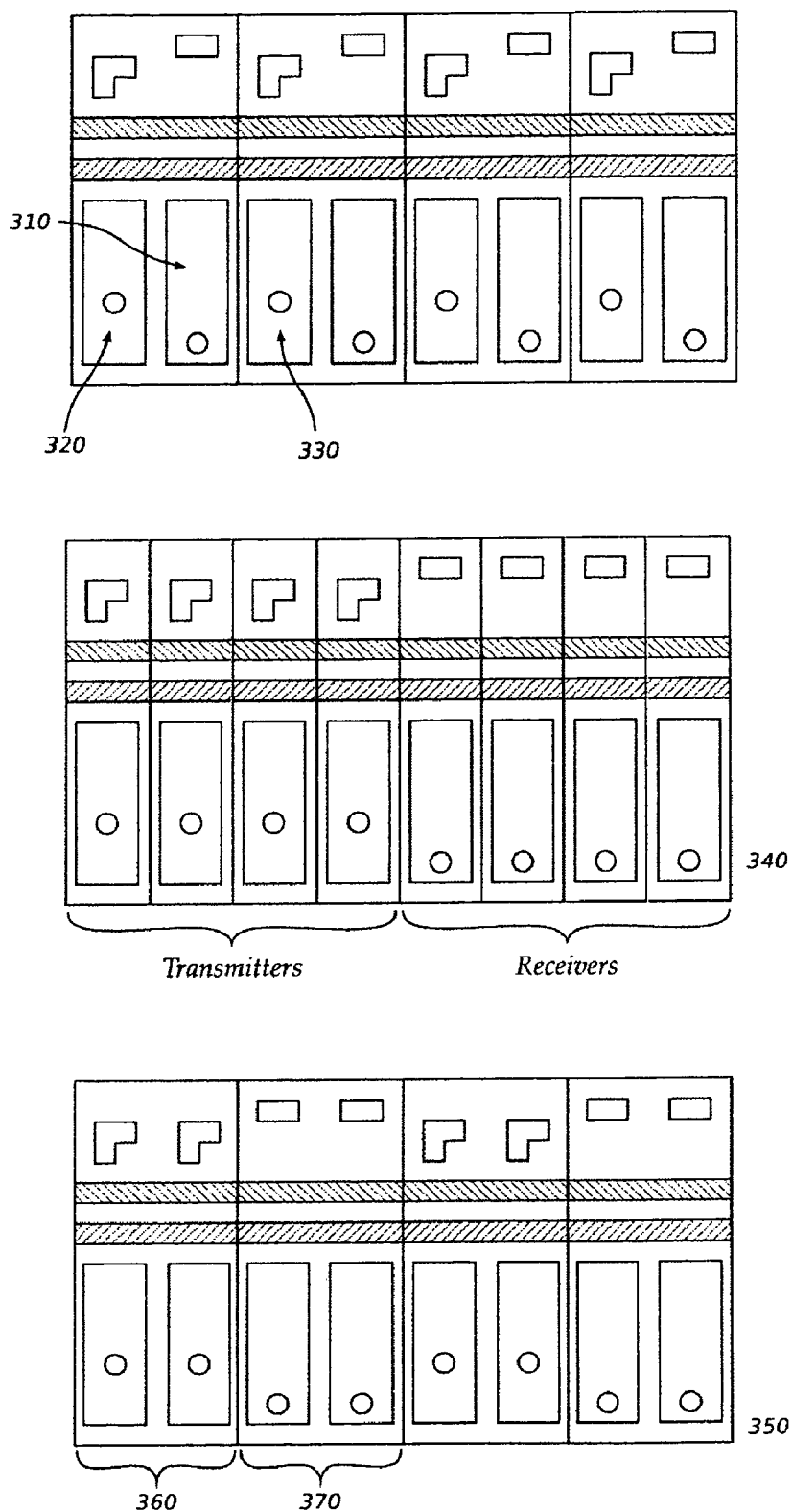
FIG. 3 illustrates a problem with the prior art transmitter-receiver spline, and shows two possible ways of addressing the problem.
Figure 5:
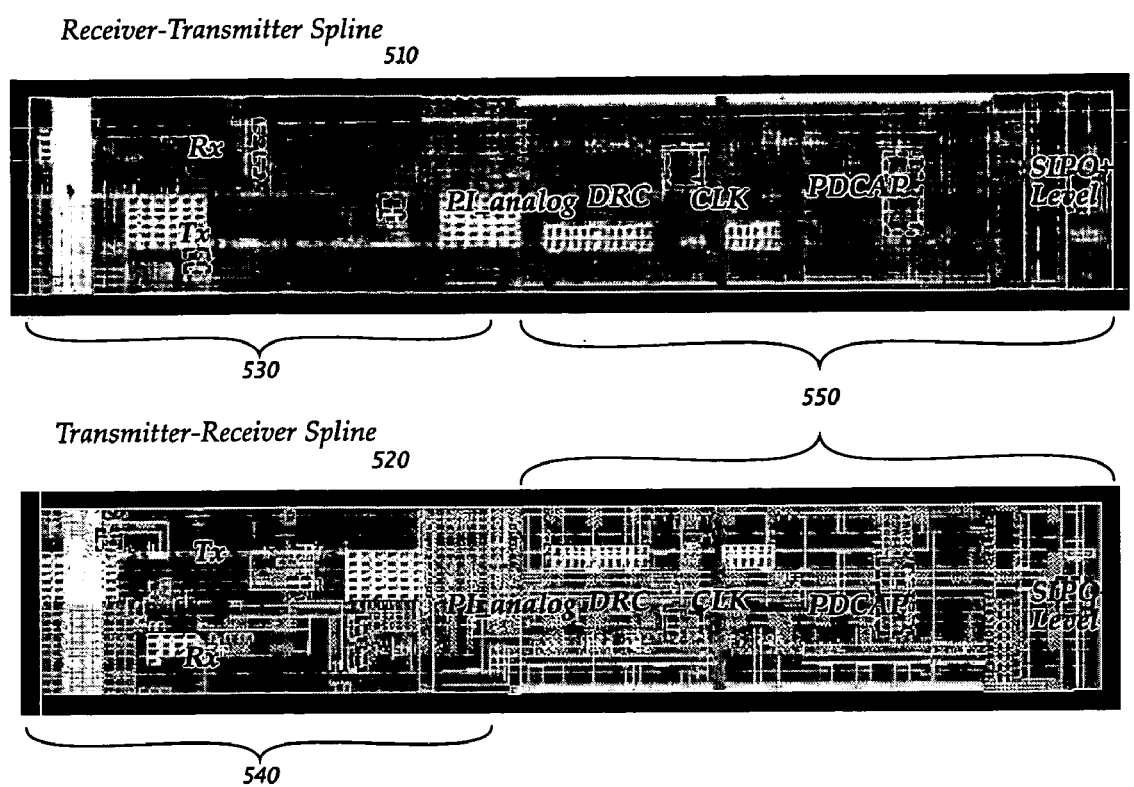
FIG. 5 is an image of an actual semiconductor layout according to an embodiment of the invention.

The splines shown in FIGS. 2, 3 and 4 are highly simplified and do not show the complex semiconductor, insulator, and metal patterns that an actual spline would contain. Thus, one should not be misled into believing that the complementary splines described could be produced simply by moving a box or circle from one place to another. In fact, as FIG. 5 shows, transmitter and receiver circuits contain hundreds of circuit elements and thousands of interconnection lines. Furthermore, these circuit patterns have been highly optimized to eliminate unused space. Therefore, producing an Rx/Tx spline to complement an existing Tx/Rx spline, where the receiver/transmitter portion is different from a mirror image of the transmitter/receiver of the original, while a second portion of the spline retains its original configuration, represents a significant challenge.

FIG. 5 shows actual implementations of complementary Tx/Rx and Rx/Tx splines (510 and 520). Spline 520 was prepared by the reflection and adjustment procedure mentioned. Both complementary sections 530, 540 and similar section 550 are visible.

The applications of the present invention have been described largely by reference to specific transmitter-receiver standard cell designs. However, those of skill in the art will recognize that the improved performance and broader reusability offered by embodiments of the invention can also be applied to other standard cell designs. Such alternate designs are understood to be apprehended according to the following claims.

We claim:

1. An article of manufacture comprising:
   a plurality of electronic circuits formed on a substantially planar substrate, the plurality of circuits including a first transmitter-receiver (Tx-Rx) pair arranged in a first pattern; and
   a second Tx-Rx pair arranged in a second, complementary pattern and disposed adjacent to the first Tx-Rx pair wherein
   a receiver of the first Tx-Rx pair and a receiver of the second Tx-Rx pair are both between a transmitter of the first Tx-Rx pair and a transmitter of the second Tx-Rx pair.

2. The article of manufacture of claim 1, wherein each Tx-Rx pair is to perform single-ended signaling.

3. The article of manufacture of claim 1, wherein each Tx-Rx pair is to perform differential signaling.

4. The article of manufacture of claim 1, further comprising a third Tx-Rx pair disposed adjacent to the second Tx-Rx pair, wherein the third Tx-Rx pair is arranged in the first pattern.

5. The article of manufacture of claim 1 wherein the second pattern is different than a mirror image of the first pattern.

6. The article of manufacture of claim 1, wherein a first of the plurality of electronic circuits including the first Tx-Rx pair and a second of the plurality of electronic circuits including the second Tx-Rx pair further comprise non-complementary circuit patterns.

7. The article of manufacture of claim 6, wherein the non-complementary circuit patterns of the first and second electronic circuits contain a plurality interchangeable connection points.

8. A method comprising:
   positioning a plurality of copies of a first standard cell and a second, different standard cell, each copy located at a constant displacement from an immediately adjacent copy; wherein
   copies of the first standard cell are interleaved with copies of the second standard cell;
   each of the first standard cell and the second standard cell contain a transmitter element and a receiver element; and
   like elements of the first standard cell and the second standard cell are positioned nearer to each other when a copy of the first standard cell is positioned at the constant displacement from a copy of the second standard cell than like elements of the first standard cell would be positioned if a copy of the first standard cell is positioned at the constant displacement from another copy of the first standard cell.

9. The method of claim 8, further comprising:
   replacing a plurality of copies of a third standard cell with the plurality of interleaved copies of the first standard cell and the second standard cell, the plurality of interleaved copies maintaining locations of a plurality of connection points of the plurality of copies of the third standard cell.

10. The method of claim 8 wherein positioning comprises placing copies of the first and second standard cell so that surrounding circuitry need not be altered.

11. A system comprising:
    a plurality of transmitters and a corresponding plurality of receivers positioned in a regular array such that no receiver is between two transmitters, the array including a plurality of interleaved copies of a first spline and a second, different spline, wherein
    the first spline and the second spline maintain connection points of a plurality of copies of a third spline.

12. The system of claim 11 wherein each transmitter and each receiver is to perform single-ended signaling.

13. The system of claim 11 wherein each transmitter and each receiver is to perform differential signaling.

14. The system of claim 11 wherein a number of transmitters is a power of two.

15. The system of claim 11 wherein the second spline is different from a reflected image of the first spline.

16. The system of claim 11 wherein each of the first spline and the second spline comprise:
    one receiver; and
    one transmitter.

* * * * *